(12) United States Patent
Wang et al.

(10) Patent No.: US 11,552,241 B2
(45) Date of Patent: Jan. 10, 2023

(54) MAGNETORESISTANCE RANDOM ACCESS MEMORY (MRAM) DEVICE

(71) Applicant: UNITED MICROELECTRONICS CORP., Hsin-Chu (TW)

(72) Inventors: Hui-Lin Wang, Taipei (TW); Po-Kai Hsu, Tainan (TW); Hung-Yueh Chen, Hsinchu (TW); Yu-Ping Wang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 214 days.

(21) Appl. No.: 15/930,425

(22) Filed: May 12, 2020

(65) Prior Publication Data

US 2021/0328133 A1 Oct. 21, 2021

(30) Foreign Application Priority Data

Apr. 16, 2020 (CN) .......................... 202010298676.9

(51) Int. Cl.
*H01L 43/02* (2006.01)
*H01L 27/22* (2006.01)
*H01L 43/12* (2006.01)

(52) U.S. Cl.
CPC ............ *H01L 43/02* (2013.01); *H01L 27/222* (2013.01); *H01L 43/12* (2013.01)

(58) Field of Classification Search
CPC ....... H01L 43/02; H01L 27/222; H01L 43/12; H01L 43/08; H01L 21/76841; H01L 23/53209; H01L 27/228; G11C 11/161
See application file for complete search history.

(56) References Cited

U.S. PATENT DOCUMENTS

| | | | |
|---|---|---|---|
| 6,441,419 B1* | 8/2002 | Johnson | H01L 21/76843 257/E21.018 |
| 7,569,467 B2* | 8/2009 | Katou | H01L 21/76843 257/E21.582 |
| 9,818,935 B2 | 11/2017 | Chuang et al. | |
| 2005/0158999 A1* | 7/2005 | Lin | H01L 21/321 257/E21.582 |
| 2005/0245065 A1* | 11/2005 | Motoyama | H01L 21/76877 257/E21.585 |
| 2008/0277703 A1 | 11/2008 | Iwayama | |
| 2011/0260271 A1 | 10/2011 | Fukui | |
| 2013/0201757 A1 | 8/2013 | Li | |
| 2016/0322090 A1 | 11/2016 | Chan | |
| 2018/0166501 A1* | 6/2018 | Chuang | H01L 43/08 |
| 2019/0280047 A1* | 9/2019 | Indukuri | H01L 27/11507 |
| 2020/0136039 A1* | 4/2020 | Tsai | H01L 45/08 |

* cited by examiner

*Primary Examiner* — Davienne N Monbleau
*Assistant Examiner* — Nader M Elmarhoumi
(74) *Attorney, Agent, or Firm* — Winston Hsu (57) ABSTRACT

A method for fabricating a semiconductor device includes the steps of: forming a first metal interconnection on a substrate; forming a stop layer on the first metal interconnection; removing the stop layer to form a first opening; forming an electromigration enhancing layer in the first opening; and forming a second metal interconnection on the electromigration enhancing layer. Preferably, top surfaces of the electromigration enhancing layer and the stop layer are coplanar.

7 Claims, 6 Drawing Sheets

MAGNETORESISTANCE RANDOM ACCESS MEMORY (MRAM) DEVICE

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating a semiconductor device includes the steps of forming a first metal interconnection on a substrate; forming a stop layer on the first metal interconnection; removing the stop layer to form a first opening; forming an electromigration enhancing layer in the first opening; and forming a second metal interconnection on the electromigration enhancing layer.

According to another aspect of the present invention, a semiconductor device includes a first metal interconnection on a substrate, an electromigration enhancing layer on the first metal interconnection, a stop layer around the electromigration enhancing layer, and a second metal interconnection on the electromigration enhancing layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
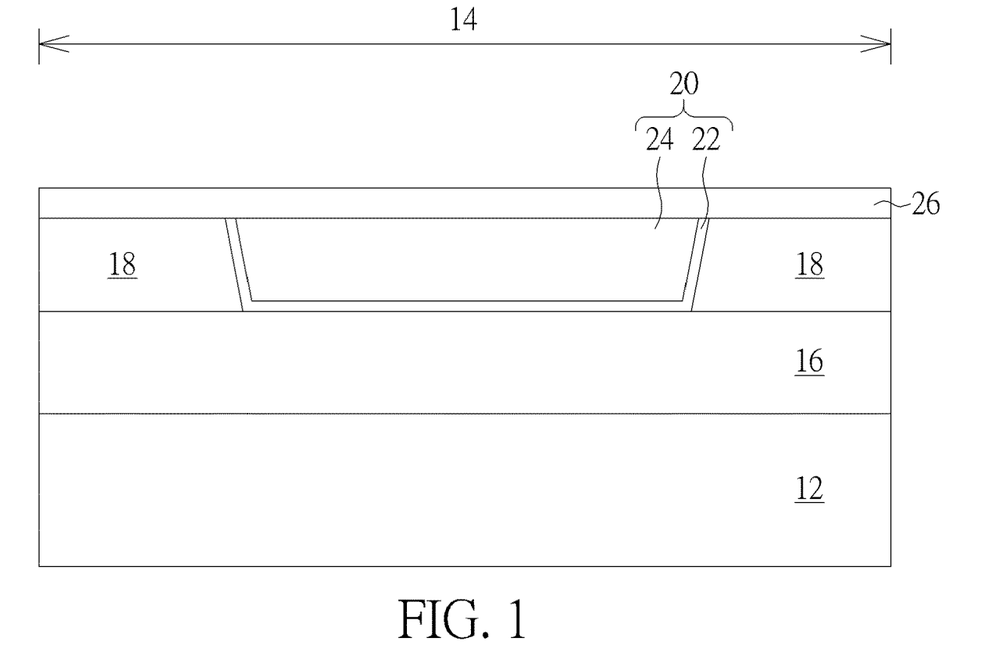
FIGS. 1-5 illustrate a method for fabricating a semiconductor device according to an embodiment of the present invention.

Referring to FIGS. 1-5, FIGS. 1-5 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MRAM region 14 and a logic region (not shown) are defined on the substrate 12.

Active devices such as metal-oxide semiconductor (MOS) transistors, passive devices, conductive layers, and an interlayer dielectric (ILD) layer 16 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 16 could be formed on the substrate 12 to cover the MOS transistors, and a plurality of contact plugs could be formed in the ILD layer 16 to electrically connect to the gate structure and/or source/drain region of MOS transistors. Since the fabrication of planar or non-planar transistors and ILD layer is well known to those skilled in the art, the details of which are not explained herein for the sake of brevity.

Next, an inter-metal dielectric (IMD) layer 18 is formed on the ILD layer 16, at least a metal interconnection 20 is formed in the IMD layer 18 to electrically connect the aforementioned contact plugs, and a stop layer 26 is formed on the surface of the IMD layer 18 and metal interconnection 20. In this embodiment, the stop layer 26 could include nitrogen doped carbide (NDC), silicon nitride, silicon carbon nitride (SiCN), or combination thereof, the metal interconnection 20 preferably includes a trench conductor, and the metal interconnection 20 could be formed in the IMD layer 18 according to a single damascene process or dual damascene process. For instance, the metal interconnection 20 could further include a barrier layer 22 and a metal layer 24, in which the barrier layer 22 could be selected from the group consisting of titanium (Ti), titanium nitride (TiN), tantalum (Ta), and tantalum nitride (TaN) and the metal layer 24 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layer 24 preferably includes copper, the IMD layer 18 preferably includes an ultra low-k (ULK) dielectric layer including but not limited to for example porous material or silicon oxycarbide (SiOC), and the stop layer 26 preferably includes SiCN.

Figure 2:
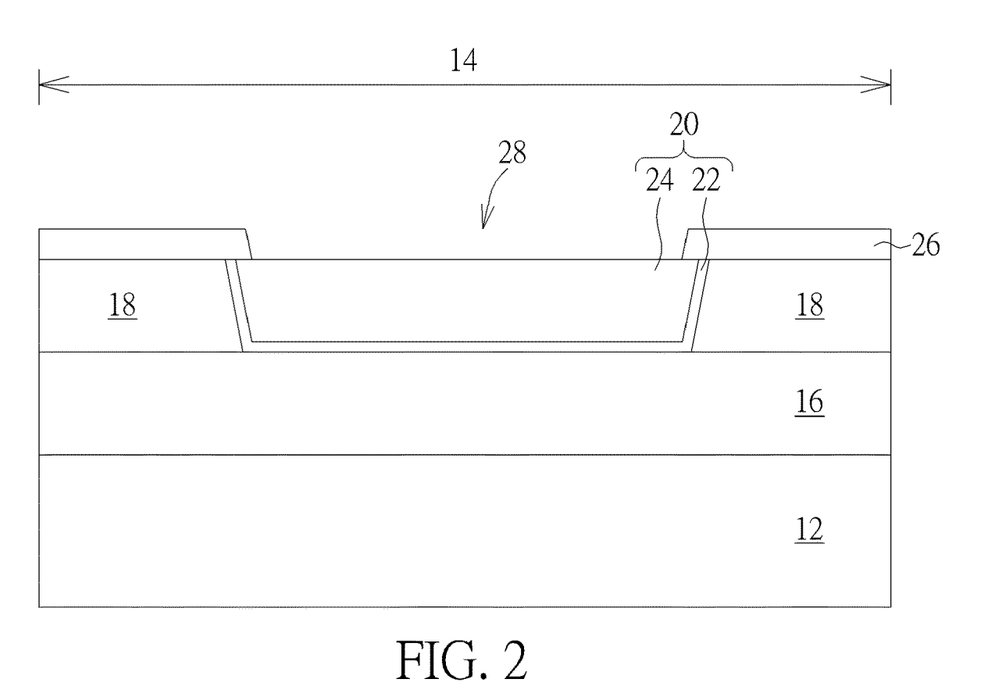

Next, as shown in FIG. 2, a pattern transfer process is conducted to remove part of the stop layer 26 for forming an opening 28 exposing the top surface of the metal interconnection 20 underneath.

Figure 3:
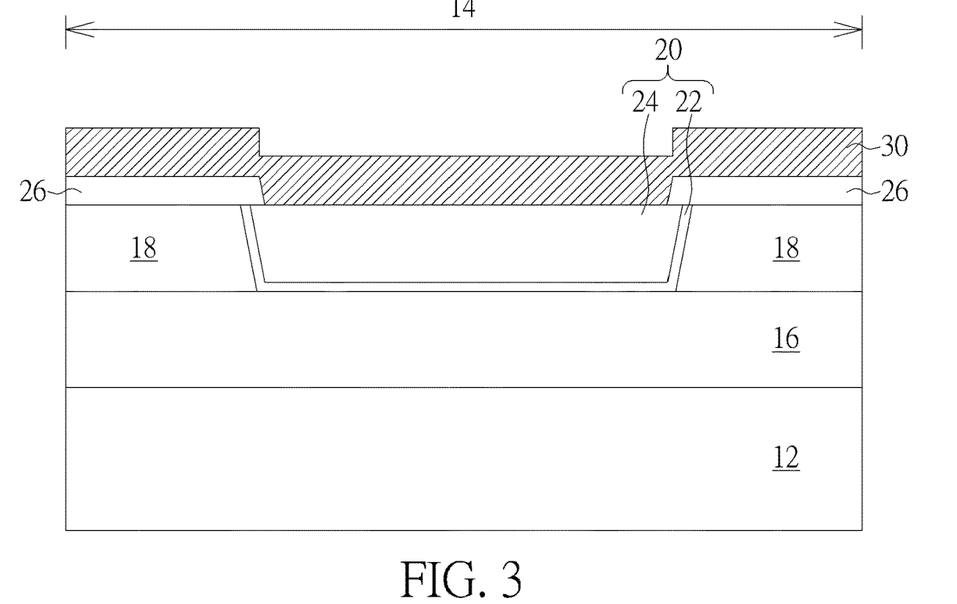

Next, as shown in FIG. 3, an electromigration enhancing layer 30 is formed on the stop layer 26 and filling the opening 28 completely. Preferably, the electromigration enhancing layer 30 is formed to improve the electromigration effect between the metal interconnection 20 underneath and the metal interconnection formed on top of the electromigration enhancing layer 30 afterwards such that collapse of the metal interconnection formed afterwards as a result of loss of copper atoms in the metal interconnection 20 could be prevented. In this embodiment, the electromigration enhancing layer 30 could include tantalum (Ta), tantalum nitride (TaN), titanium, (Ti), titanium nitride (TiN), or combination thereof and most preferably include Ti and TiN at the same time.

Figure 4:
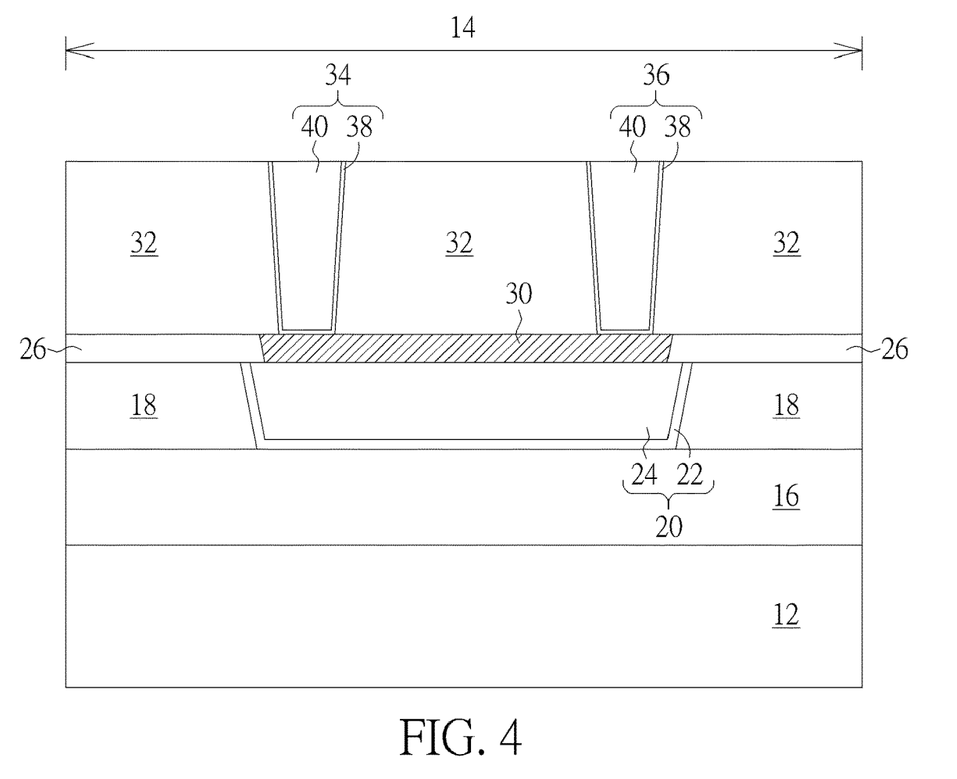

Next, as shown in FIG. 4, a planarizing process such as chemical mechanical polishing (CMP) process is conducted to remove part of the electromigration enhancing layer 30 and even part of the stop layer 26 so that the top surfaces of the remaining electromigration enhancing layer 30 and stop layer 26 are coplanar. Next, an IMD layer 32 is formed on the surface of the stop layer 26 and electromigration enhancing layer 30 and metal interconnections 34, 36 are formed in the IMD layer 32 to electrically connect the electromigration enhancing layer 30. In this embodiment, each of the metal interconnections 34, 36 could include a via conductor and the metal interconnections 34, 36 could be formed in the IMD layer 32 according to a single damascene process or dual damascene process. For instance, each of the metal interconnection 34, 36 could further include a barrier layer 38 and a metal layer 40, in which the barrier layer 38 could be selected from the group consisting of titanium (Ti), titanium nitride (TiN), tantalum (Ta), and tantalum nitride (TaN) and the metal layer 40 could be selected from the group consisting of tungsten (W), copper (Cu), aluminum (Al), titanium aluminide (TiAl), and cobalt tungsten phosphide (CoWP).

Figure 5:
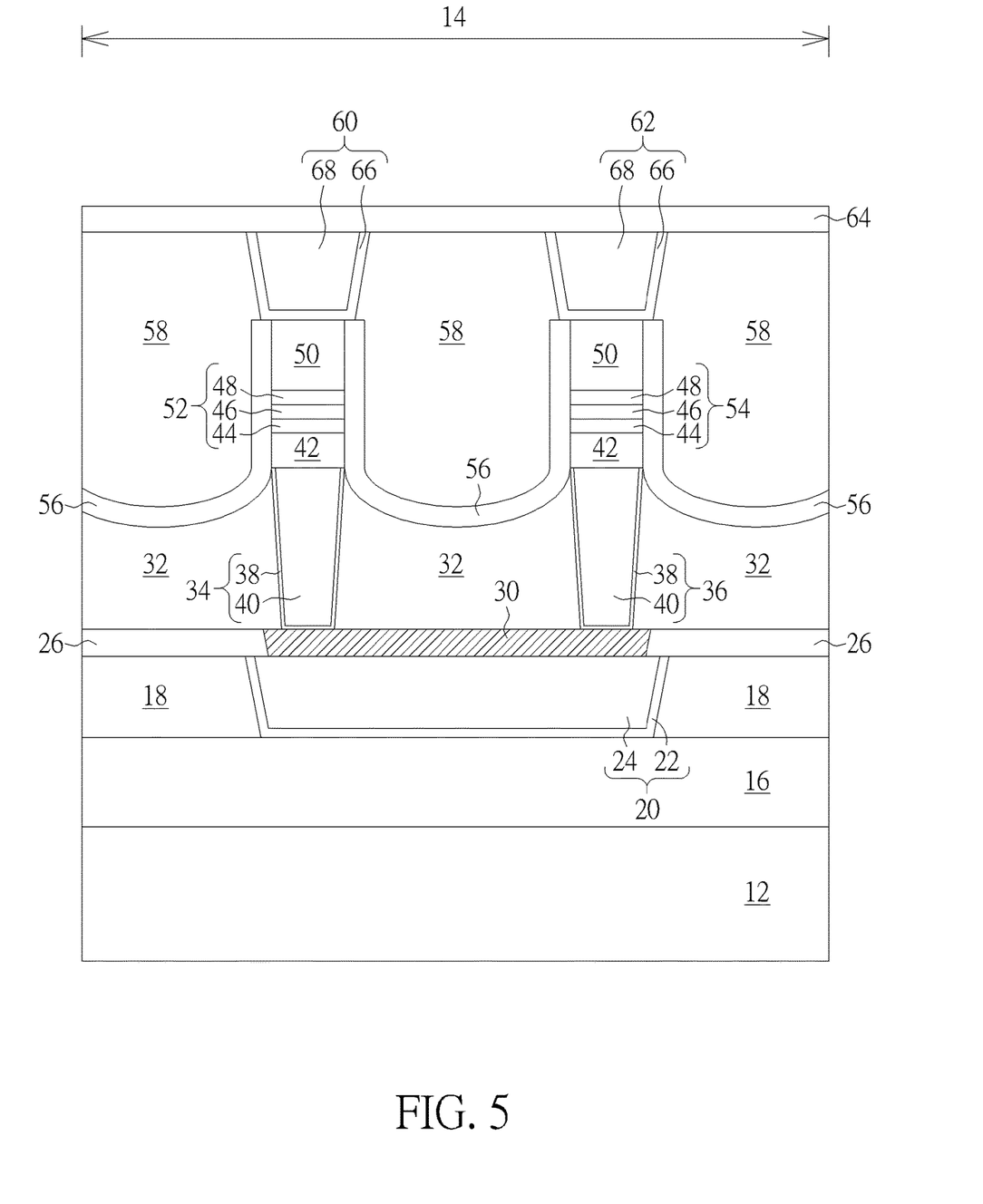

Next, as shown in FIG. 5, a MTJ stack (not shown) or stack structure is formed on the metal interconnections 34, 36 and IMD layer 32. In this embodiment, the formation of the MTJ stack could be accomplished by sequentially depositing a bottom electrode 42, a pinned layer 44, a barrier layer 46, a free layer 48, and a top electrode 50 on the IMD layer 32. In this embodiment, the bottom electrode 42 and the top electrode 50 are preferably made of conductive material including but not limited to for example Ta, Pt, Cu, Au, Al, or combination thereof. The pinned layer 44 could be made of antiferromagnetic (AFM) material including but not limited to for example ferromanganese (FeMn), platinum manganese (PtMn), iridium manganese (IrMn), nickel oxide (NiO), or combination thereof, in which the pinned layer 44 is formed to fix or limit the direction of magnetic moment of adjacent layers. The barrier layer 46 could be made of insulating material including but not limited to for example oxides such as aluminum oxide ($AlO_x$) or magnesium oxide (MgO). The free layer 48 could be made of ferromagnetic material including but not limited to for example iron, cobalt, nickel, or alloys thereof such as cobalt-iron-boron (CoFeB), in which the magnetized direction of the free layer 48 could be altered freely depending on the influence of outside magnetic field.

Next, one or more etching process could be conducted to remove part of the MTJ stack to form MTJs 52, 54 on the metal interconnections 34, 36, in which bottom electrodes 42 are disposed under the MTJs 52, 54 while top electrodes 50 are disposed on top of the MTJs 52, 54. It should be noted that a reactive ion etching (ME) process and/or an ion beam etching (IBE) process could be conducted to remove part of the MTJ stack and even part of the IMD layer 32 for forming the MTJs 54, 54. Due to the characteristics of the IBE process, the top surface of the remaining IMD layer 32 is slightly lower than the top surface of the metal interconnections 34, 36 after the IBE process and the top surface of the IMD layer 32 also reveals a curve or an arc. Next, a cap layer 56 is formed on the MTJs 52, 54 and covering the surface of the IMD layer 32, an IMD layer 58 is formed on the cap layer 56, and one or more photo-etching process is conducted to remove part of the IMD layer 58 and part of the cap layer 56 to form contact holes (not shown) exposing the top electrodes 50. Next, conductive materials are deposited into the contact holes and planarizing process such as CMP is conducted to form metal interconnections 60, 62 connecting the top electrodes 50 underneath. Next, another stop layer 64 is formed on the IMD layer 58 and covering the metal interconnections 60, 62.

In this embodiment, the stop layer 56 preferably includes silicon nitride, but could also include other dielectric material including but not limited to for example silicon oxide, silicon oxynitride (SiON), or SiCN depending on the demand of the product. The stop layers 26, 64 could include same or different materials while both stop layers 26, 64 could include nitrogen doped carbide (NDC), silicon nitride, silicon carbon nitride (SiCN), and most preferably SiCN. Similar to the aforementioned metal interconnections, the metal interconnections 60, 62 could be formed in the IMD layer 58 according to a single damascene process or dual damascene process. For instance, each of the metal interconnection 60, 62 could further include a barrier layer 66 and a metal layer 68, in which the barrier layer 66 could be selected from the group consisting of titanium (Ti), titanium nitride (TiN), tantalum (Ta), and tantalum nitride (TaN) and the metal layer 68 could be selected from the group consisting of tungsten (W), copper (Cu), aluminum (Al), titanium aluminide (TiAl), and cobalt tungsten phosphide (CoWP). This completes the fabrication of a semiconductor device according to an embodiment of the present invention.

Referring again to FIG. 5, FIG. 5 further illustrates a structural view of a semiconductor device according to an embodiment of the present invention. As shown in FIG. 5, the semiconductor device includes at least a metal interconnection 20 disposed on the substrate 12, an electromigration enhancing layer 30 disposed on the surface of the metal interconnection 20, a stop layer 26 surrounding the electromigration enhancing layer 30, metal interconnections 34, 36 disposed on the electromigration enhancing layer 30, an IMD layer 32 surrounding the metal interconnections 34, 36, an MTJ 52 disposed on the metal interconnection 34, and another MTJ 54 disposed on the metal interconnection 36.

In this embodiment, the top surface of the electromigration enhancing layer 30 is even with the top surface of the stop layer 26, the metal interconnections 34, 36 and the metal interconnection 20 are preferably made of different materials, the metal interconnections 34, 36 and the electromigration enhancing layer 30 are preferably made of different materials, and the metal interconnection 20 and the electromigration enhancing layer 30 are also made of different materials. Specifically, the metal layer 24 in the metal interconnection 20 preferably includes copper, the metal layer 40 in the metal interconnections 34, 36 preferably include tungsten, and the electromigration enhancing layer 30 preferably include tantalum (Ta), tantalum nitride (TaN), titanium, (Ti), titanium nitride (TiN), or combination thereof and most preferably include Ti and TiN at the same time. It should be noted that even though the width of the electromigration enhancing layer 30 is less than the width of the metal interconnection 20, according to other embodiment of the present invention it would also be desirable to adjust the width of the electromigration enhancing layer 30 by extending the edges of the electromigration enhancing layer 30 toward left and/or right so that the electromigration enhancing layer 30 could be extended to cover the metal interconnection 20 and the IMD layer 18 on either one side or both sides. In other words, the width of the electromigration enhancing layer 30 could be less than, equal to, or greater than the width of the metal interconnection 20, which are all within the scope of the present invention.

Figure 6:
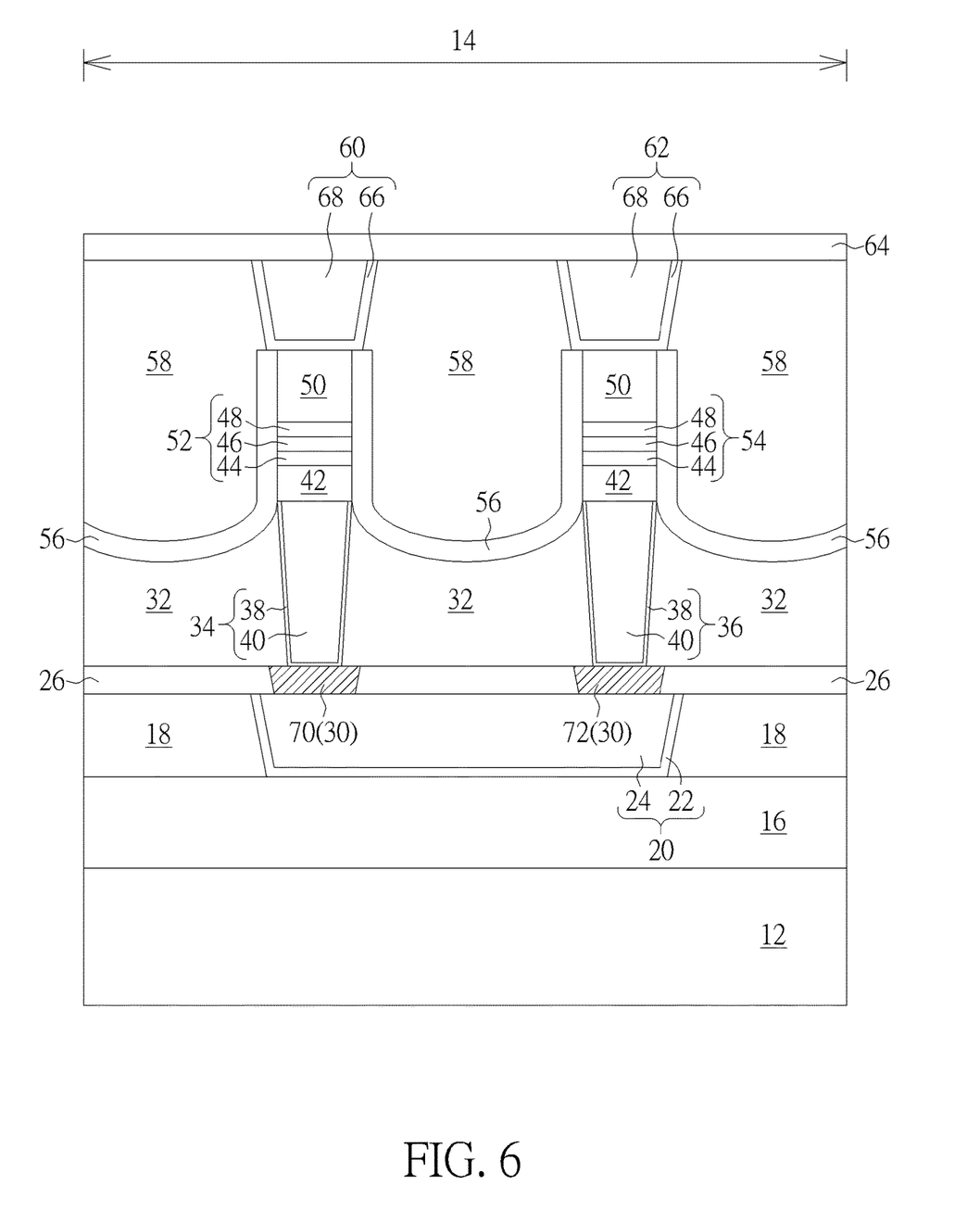
FIG. 6 illustrates a structural view of a semiconductor device according to an embodiment of the present invention.

Referring to FIG. 6, FIG. 6 illustrates a structural view of a semiconductor device according to an embodiment of the present invention. As shown in FIG. 6, in contrast to the pattern transfer process conducted in FIG. 2 of removing part of the stop layer 26 to form only a single opening 28 exposing the metal interconnection 20, it would be desirable to adjust the number and position of the openings formed during the aforementioned pattern transfer process conducted in FIG. 2 by forming two openings such as a first opening (not shown) and a second opening (not shown) exposing the surface of the metal interconnection 20. Next, processes conducted in FIGS. 3-5 are carried out to form an electromigration enhancing layer 30 on the stop layer 26 and filling the two openings and then conduct a planarizing process such as CMP to remove part of the electromigration enhancing layer 30 for forming a first electromigration layer 70 and a second electromigration layer 72 in the stop layer 26 such that the top surface of the first electromigration enhancing layer 70 and the second electromigration layer 72 are even with the top surface of the stop layer 26. Next, MTJs 52, 54 are formed on the metal interconnections 34, 36, a cap layer 56 and IMD layer 58 are formed to cover the MTJs 52, 54, metal interconnections 60, 62 are formed in the IMD layer 58 to electrically connect the top electrodes 50 disposed on each of the MTJs 52, 54, and another stop layer 64 is formed on the IMD layer 58 and the metal interconnections 60, 62.

In contrast to the aforementioned embodiment of forming a single electromigration enhancing layer 30 in the stop layer 26, the pattern transfer process conducted in this embodiment preferably forms two patterned electromigration enhancing layer including the first electromigration enhancing layer 70 and the second electromigration layer 72 in the stop layer 26, in which the first electromigration enhancing layer 70 and the second electromigration layer 72 are electrically connected or even directly contacting the metal interconnections 34, 36 directly under the MTJs 52, 54 while the top surfaces of the first electromigration enhancing layer 70, the second electromigration layer 72, and the stop layer 26 are coplanar. Similar, the widths of each of the patterned electromigration enhancing layers 30 could be adjusted to be less than, equal to, or greater than the width of the MTJs on top. For instance, the width of the first electromigration enhancing layer 70 could be less than, equal to, or greater than the width of the MTJ 52 and the width of the second electromigration enhancing layer 72 could be less than, equal to, or greater than the width of the MTJ 54.

Figure 7:
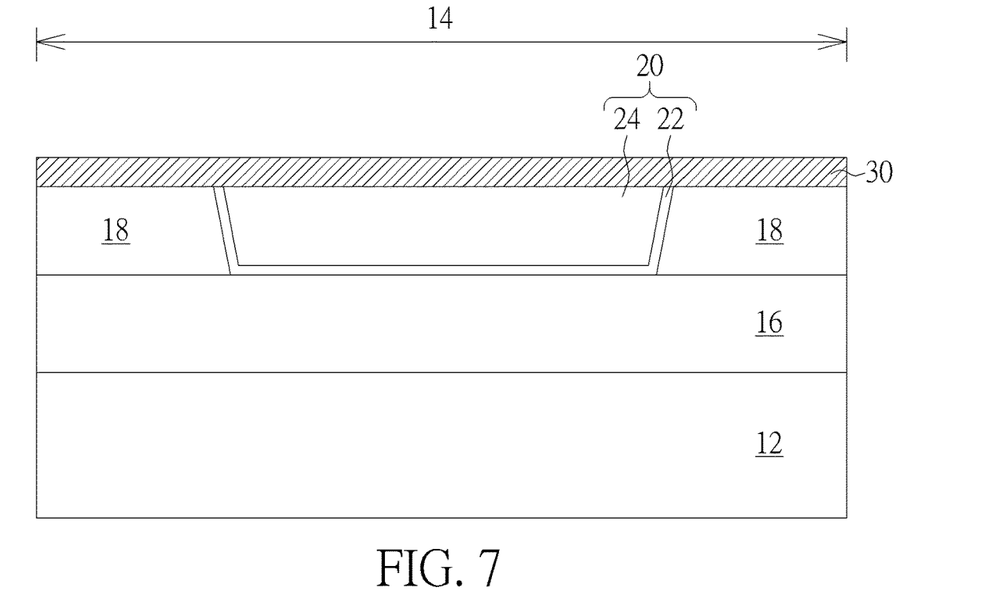
FIGS. 7-9 illustrate a method for fabricating a semiconductor device according to an embodiment of the present invention.
Figure 8:
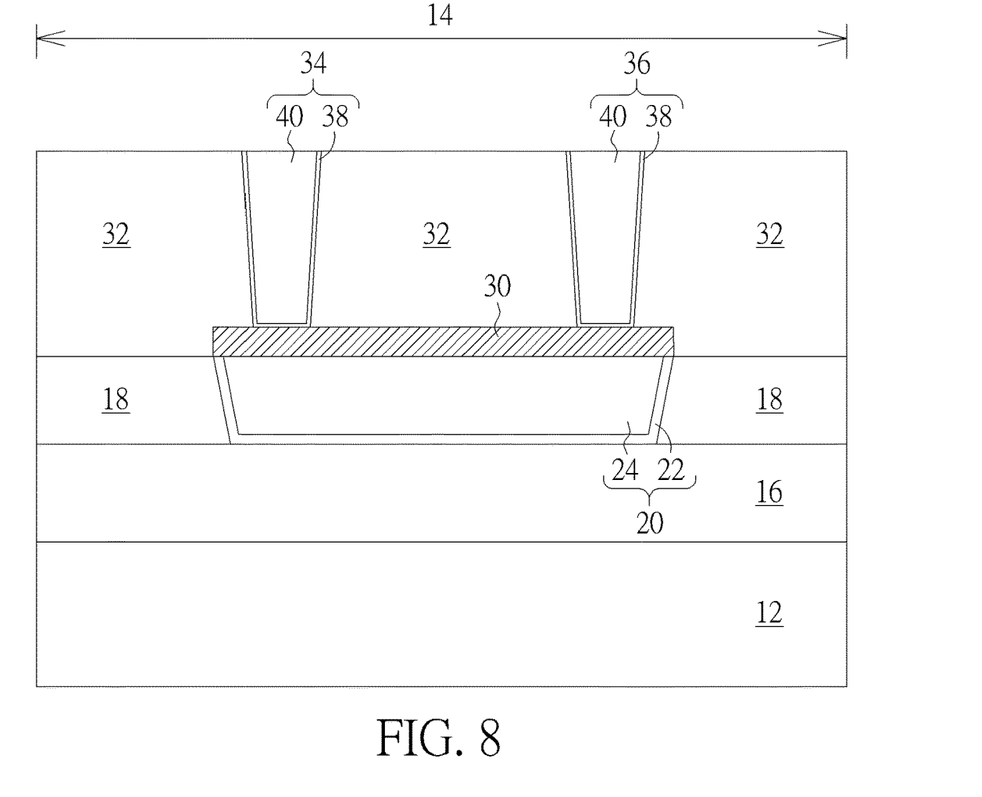
Figure 9:
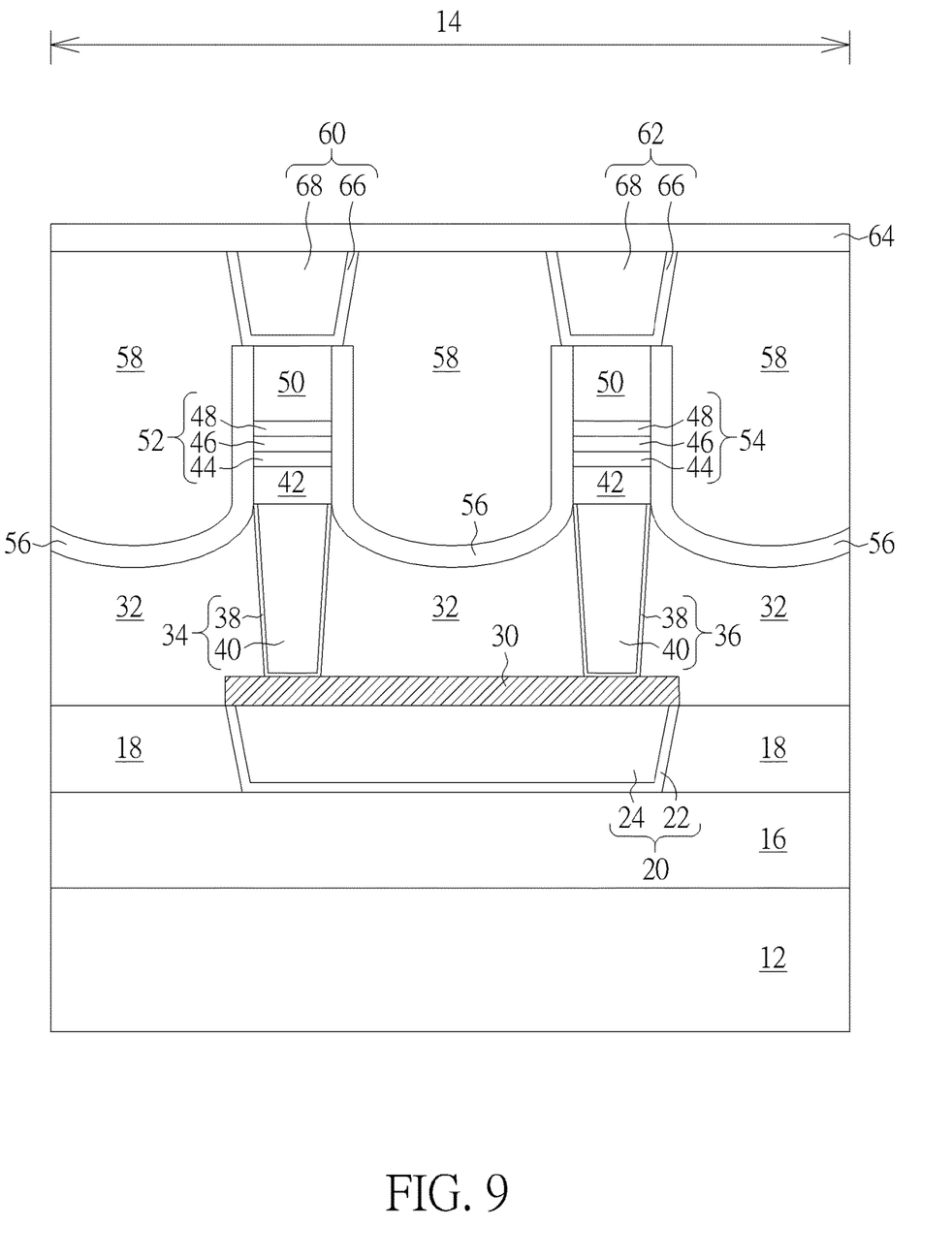

Referring to FIGS. 7-9, FIGS. 7-9 illustrate a method for fabricating a semiconductor device, or more specifically a MRAM device according to an embodiment of the present invention. For simplicity purpose, elements from the aforementioned embodiments are labeled with same numberings. As shown in FIG. 7, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MRAM region 14 and a logic region (not shown) are defined on the substrate 12.

Active devices such as metal-oxide semiconductor (MOS) transistors, passive devices, conductive layers, and an interlayer dielectric (ILD) layer 16 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 16 could be formed on the substrate 12 to cover the MOS transistors, and a plurality of contact plugs could be formed in the ILD layer 16 to electrically connect to the gate structure and/or source/drain region of MOS transistors. Since the fabrication of planar or non-planar transistors and ILD layer is well known to those skilled in the art, the details of which are not explained herein for the sake of brevity.

Next, an inter-metal dielectric (IMD) layer 18 is formed on the ILD layer 16, at least a metal interconnection 20 is formed in the IMD layer 18 to electrically connect the aforementioned contact plugs, and an electromigration enhancing layer 30 is formed on the surface of the IMD layer 18 and metal interconnection 20. In this embodiment, the metal interconnection 20 preferably includes a trench conductor and the metal interconnection 20 could be formed in the IMD layer 18 according to a single damascene process or dual damascene process. For instance, the metal interconnection 20 could further include a barrier layer 22 and a metal layer 24, in which the barrier layer 22 could be selected from the group consisting of titanium (Ti), titanium nitride (TiN), tantalum (Ta), and tantalum nitride (TaN) and the metal layer 24 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layer 24 preferably includes copper and the IMD layer 18 preferably includes an ultra low-k (ULK) dielectric layer including but not limited to for example porous material or silicon oxycarbide (SiOC).

Next as shown in FIG. 8, a photo-etching process is conducted to pattern the electromigration enhancing layer 30 by using a patterned mask to remove part of the electromigration enhancing layer 30 on the surface of the IMD layer 18 so that the remaining of the electromigration enhancing layer 30 still covers the entire surface of the metal interconnection 20. Next, an IMD layer 32 is formed on the surface of the electromigration enhancing layer 30 and IMD layer 18 and metal interconnections 34, 36 are formed in the IMD layer 32 to electrically connect or directly contacting the electromigration enhancing layer 30. In this embodiment, each of the metal interconnections 34, 36 could include a via conductor and the metal interconnections 34, 36 could be formed in the IMD layer 32 according to a single damascene process or dual damascene process. For instance, each of the metal interconnection 34, 36 could further include a barrier layer 38 and a metal layer 40, in which the barrier layer 38 could be selected from the group consisting of titanium (Ti), titanium nitride (TiN), tantalum (Ta), and tantalum nitride (TaN) and the metal layer 40 could be selected from the group consisting of tungsten (W), copper (Cu), aluminum (Al), titanium aluminide (TiAl), and cobalt tungsten phosphide (CoWP).

Next, as shown in FIG. 9, processes conducted in FIG. 5 are carried out to form MTJs 52, 54 on the metal interconnections 34, 36, a cap layer 56 and an IMD layer 58 on the MTJs 52, 54, metal interconnections 60, 62 in the IMD layer 58 to electrically connect the MTJs 52, 54, and a stop layer 64 on the IMD layer 58 and the metal interconnections 60, 62. In contrast to surrounding the electromigration enhancing layer 30 with a stop layer 26 as the top surfaces of the electromigration enhancing layer 30 and stop layer 26 are coplanar in the aforementioned embodiment, no stop layer is formed around the electromigration enhancing layer 30 in this embodiment as the electromigration enhancing layer 30 is surrounded by an IMD layer instead. It should also be noted that even though the width or sidewalls of the electromigration layer 30 in this embodiment are aligned with edges or sidewalls of the metal interconnection 20 underneath, according to other embodiment of the present invention it would also be desirable to adjust the width of the electromigration enhancing layer 30 so that the width of the electromigration enhancing layer 30 could be less than the width of the metal interconnection 20 or extended toward left and right to cover the metal interconnection 20 and the IMD layer 18 on either one side or both sides, which are all within the scope of the present invention.

In current fabrication of MRAM units especially during the connection between metal interconnections such as the metal interconnections 34, 36 in the aforementioned embodiments that are made of tungsten (W) directly under MTJ arrays and metal interconnections such as the metal interconnection 20 on even lower level that are made of copper (Cu), collapse of tungsten metal interconnections 34, 36 is often observed due to copper loss from metal interconnection 20 underneath. To resolve this issue the present invention employs a damascene process approach to form an electromigration enhancing layer made of Ta, TaN, Ti, TiN, or combination thereof on the copper metal interconnection for improving electromigration effect between the lower copper metal interconnection 20 and upper tungsten metal interconnections 34, 36 so that collapse of the tungsten metal interconnections 34, 36 could be prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a first metal interconnection on a substrate;
    an electromigration enhancing layer on the first metal interconnection, wherein the electromigration enhancing layer is a single electromigration enhancing layer;
    a stop layer around the electromigration enhancing layer; and
    a second metal interconnection and a third metal interconnection on the single electromigration enhancing layer.

2. The semiconductor device of claim 1, further comprising:
    a first inter-metal dielectric (IMD) layer around the first metal interconnection;
    a second IMD layer around the second metal interconnection and the third metal interconnection;
    a first magnetic tunneling junction (MTJ) on the second metal interconnection; and
    a second MTJ on the third metal interconnection.

3. The semiconductor device of claim 1, wherein top surfaces of the electromigration enhancing layer and the stop layer are coplanar.

4. The semiconductor device of claim 1, wherein the first metal interconnection and the second metal interconnection comprise different materials.

5. The semiconductor device of claim 1, wherein the first metal interconnection and the electromigration enhancing layer comprise different materials.

6. The semiconductor device of claim 1, wherein the second metal interconnection and the electromigration enhancing layer comprise different materials.

7. A semiconductor device, comprising:
    a first metal interconnection on a substrate, wherein the first metal interconnection is a single first metal interconnection;
    a first electromigration enhancing layer and a second electromigration enhancing layer on the single first metal interconnection;
    a stop layer around the first electromigration enhancing layer and the second electromigration enhancing layer; and
    a second metal interconnection on the first electromigration enhancing layer.

* * * * *